United States Patent
Mansoorian et al.

(10) Patent No.: US 9,019,139 B2
(45) Date of Patent: Apr. 28, 2015

(54) ANALOG TO DIGITAL CONVERTER WITH BUILT-IN DATA COMPRESSION BASED ON SHOT NOISE OF IMAGE SENSOR

(71) Applicants: Barmak Mansoorian, Pasadena, CA (US); Steven Huang, Pasadena, CA (US); Rami Tantawy, Pasadena, CA (US)

(72) Inventors: Barmak Mansoorian, Pasadena, CA (US); Steven Huang, Pasadena, CA (US); Rami Tantawy, Pasadena, CA (US)

(73) Assignee: Forza Silicon, Pasadena, CA (US)

( * ) Notice: Subject to any disclaimer, the term of this patent is extended or adjusted under 35 U.S.C. 154(b) by 0 days.

(21) Appl. No.: 13/752,691

(22) Filed: Jan. 29, 2013

(65) Prior Publication Data

US 2013/0314265 A1 Nov. 28, 2013

Related U.S. Application Data

(60) Provisional application No. 61/651,248, filed on May 24, 2012.

(51) Int. Cl.
*H03M 1/12* (2006.01)
*H03M 1/46* (2006.01)

(52) U.S. Cl.
CPC ............ *H03M 1/1235* (2013.01); *H03M 1/464* (2013.01)

(58) Field of Classification Search
USPC ........................... 341/155, 156, 161; 330/261
See application file for complete search history.

(56) References Cited

U.S. PATENT DOCUMENTS

| | | | | |
|---|---|---|---|---|
| 4,587,443 | A * | 5/1986 | van de Plassche | 327/95 |
| 6,313,779 | B1 * | 11/2001 | Leung et al. | 341/155 |
| 6,867,723 | B1 * | 3/2005 | Tachibana et al. | 341/155 |
| 7,741,908 | B2 * | 6/2010 | Furuta | 330/253 |

* cited by examiner

*Primary Examiner* — Brian Young
(74) *Attorney, Agent, or Firm* — Law Office of Scott C Harris, Inc

(57) ABSTRACT

An A/D converter system that has a ranging detector that receives and characterizes an input signal. The characterizing sets a coarse range selection based on a level of the input signal. A higher level input signal has a higher level ranging. An A/D converter includes a compression system that compresses based on the ranging output signal by converting different numbers of bits for different level ranging output signal. A higher level input signal is more higher compressed and produces a digital output indicative of the input signal, which is compressed by different amounts based on the ranging output signal. By scaling in this way, the resolution of the A/D converter is scaled on the basis of shot noise level of the image sensor.

13 Claims, 4 Drawing Sheets

ANALOG TO DIGITAL CONVERTER WITH BUILT-IN DATA COMPRESSION BASED ON SHOT NOISE OF IMAGE SENSOR

This application claims priority from provisional application No. 61/651,248, filed May 24, 2012, the entire contents of which are herewith incorporated by reference.

BACKGROUND

The demand for high-resolution, high-frame-rate, high dynamic range, and low-noise CMOS image sensors continues to push the technology of pixel readout circuitry. To meet these demands, the analog processing circuitry can be modified to tailor to imaging specific characteristics.

SUMMARY

The present application describes an A/D converter having a first part that sets a course range selection based on the level of an input signal, where a higher level input signal has a higher level range, and an A/D converter which includes a compression system that compresses based on the level of the input signal, where more input signal is more highly compressed.

Embodiments disclosed herein describe the implementation of an Analog to Digital Converter (ADC) that compresses its data output based on the signal level being converted. The amount of data compression is determined based on the Shot Noise Level of the signal from a CMOS image sensor.

DETAILED DESCRIPTION

Figure 1:
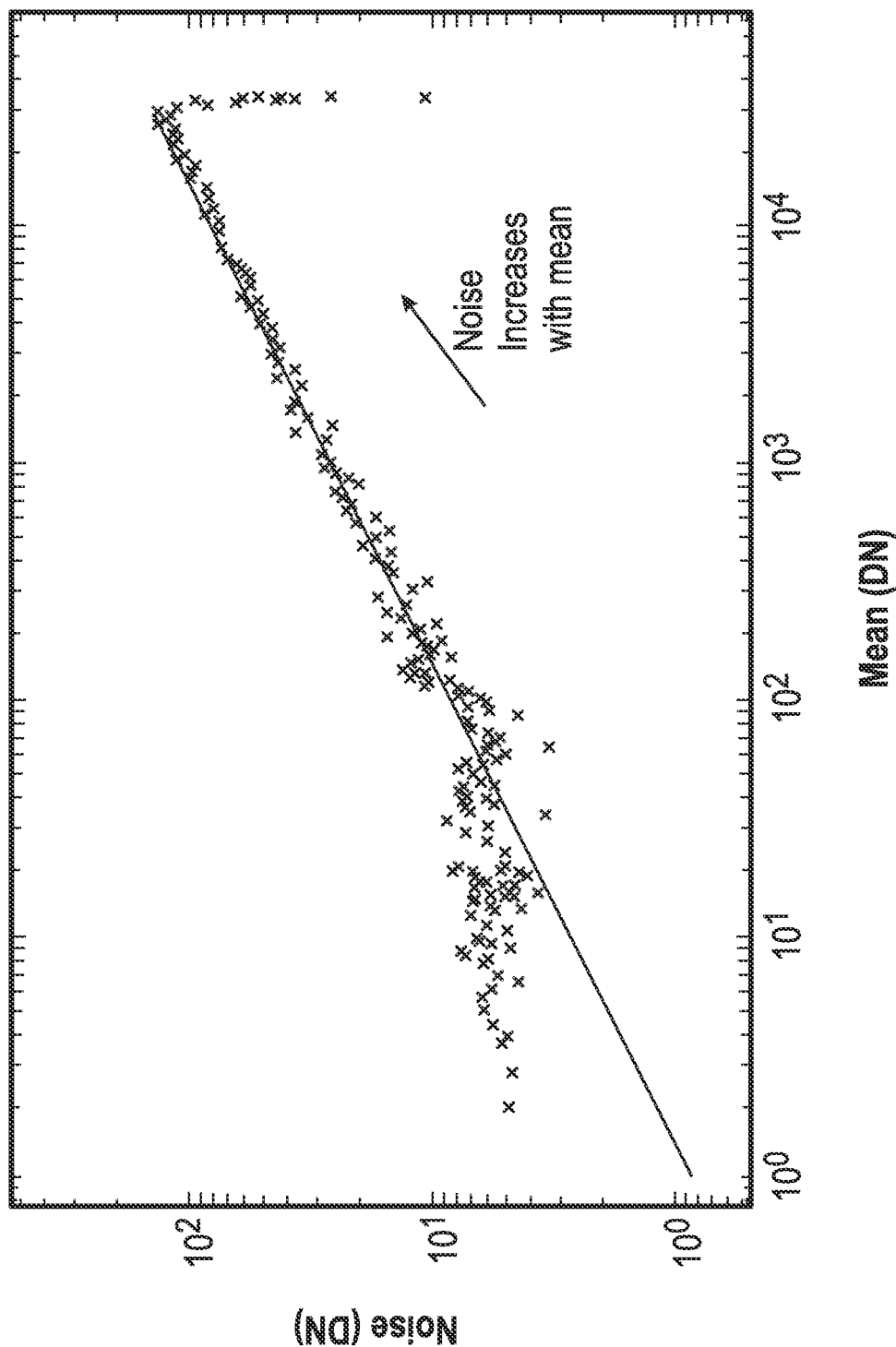
FIG. 1 shows a graph showing an exemplary noise amount as correlated with the number of photons received.

One well-known characteristic of a CMOS image sensor is its Photon Transfer Curve or PTC. The PTC curve demonstrates how the image sensor noise level increases with the signal level based on Photon Shot Noise. FIG. 1 shows a typical PTC curve of an image sensor. The x-axis of FIG. 1 represents the mean of the number of photons that have been received. It can be seen from FIG. 1 that as the number of photons collected increases, its noise level (shown in the y-axis) also increases at a rate equal to square root of the signal ($\sigma N = \sqrt{N}$).

Based on this recognition that the noise level increases with signal level, the inventors concluded that the digital data can also tolerate higher levels of lossy compression at higher signal levels. As long as the level of compression is maintained below the Photon Shot Noise, no degradation in image quality will be seen.

Designing high resolution-ADC converters, 12 bit or above, requires exponential increases in power, area, noise and design complexity. Using the Successive Approximation ADC (SAR) architecture as example, designers end up faced with a number of challenges.

ADC Area: The area taken up by the DAC increases by $2^N$ number of bits. Using multiple numbers of reference voltages allows limiting the overall capacitor size, but this then poses the challenge of generating accurate voltage references to achieve good ADC differential non-linearity.

Capacitor Matching: A second challenge is to overcome the capacitor ratio-matching requirement: for each N-bit converted, the capacitor ratio must match to the given resolution. This is especially difficult for narrow-pitch layouts and small pixel dimensions.

Reference Voltage Settling: As pixel array size increases, so does the challenge of settling the voltage references. This challenge grows with increased SAR capacitor sizes and higher bit counts.

The inventors realized that these issues can be addressed by taking advantage of the relationship between signal level and Photon Shot Noise. An embodiment of an A/D converter is disclosed where its output data is compressed by an amount that is based on the signal level. According to an embodiment, the compression is lossy compression. In one embodiment, the lossy compression is carried out by removing least significant bits based on the level of the signal, selected by an amount that loses bits below the level of the shot noise.

In one embodiment, the compression of the data is built into the ADC by varying the converter's bit accuracy. The term effective number of bits, or "ENOB" is used in this specification to describe the bit accuracy that is used. By relaxing the number of bits being resolved, all other requirements such as noise, capacitor matching and settling can also be relaxed.

Figure 2:
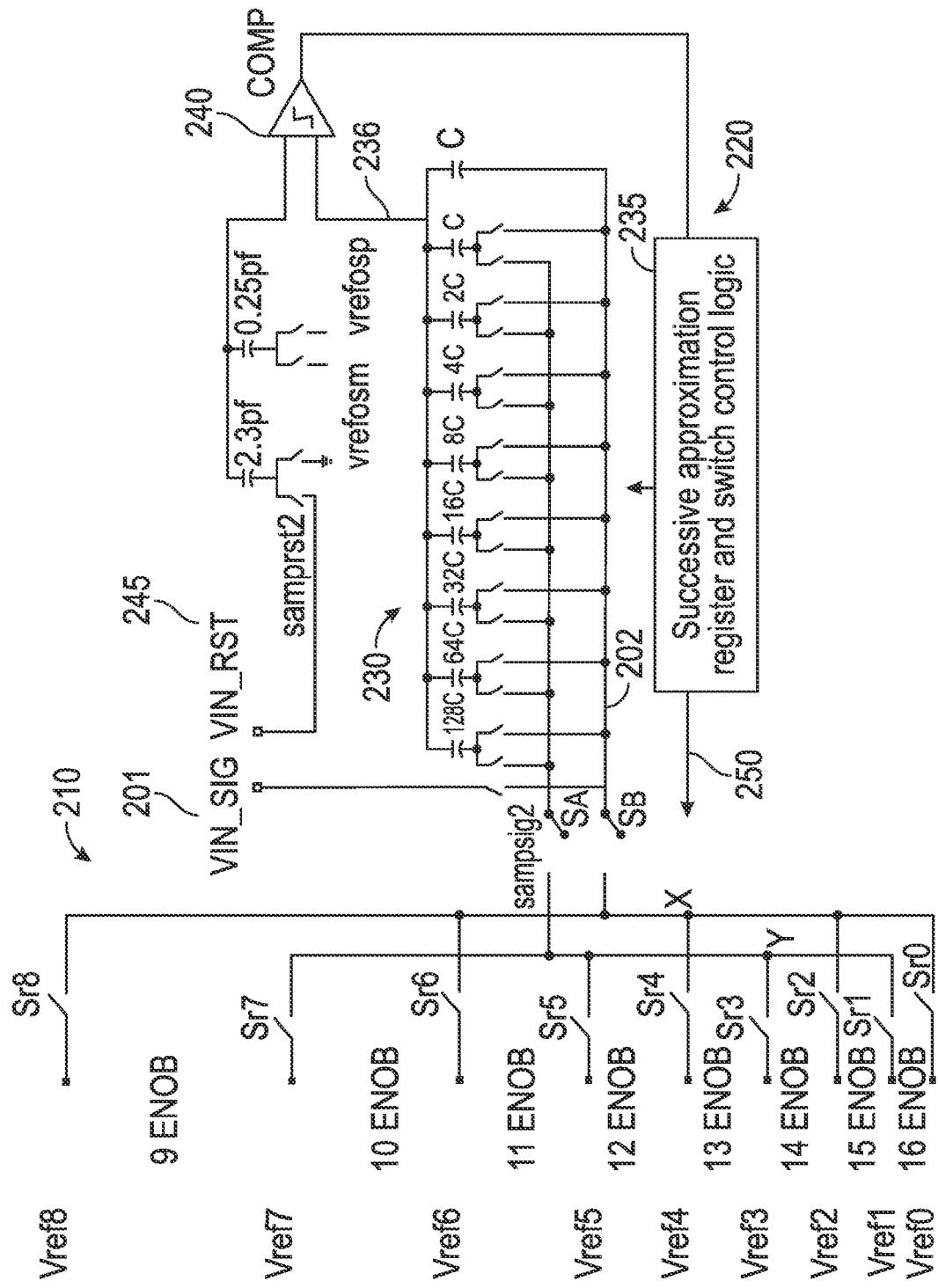
FIG. 2 shows a circuit diagram of an A/D converter according to the present system.

FIG. 2 shows a block diagram of the ADC architecture according to an embodiment that uses the techniques described above of varying compression based on level of signal. There is a 3-bit segment/ENOB selection 210 followed by an 8-bit SAR converter 220. The ENOB selection is determined using reference voltages vref8 to vref0 each of which is switched by a respective switch SR0-SR8 as sample values to use in the successive approximation operation. The reference voltage difference for each segment sets the amount of compression in the ADC data output. For example, the last segment is 9 ENOB therefore achieving 128-to-1 compression of data for a 16 bit effective ADC.

In operation, the initial operation of the ADC is carried out by comparing the input voltage to be converted 201 against each of the reference voltages using a three bit coarse range selection that is performed with a binary search, such that only 3 comparisons are needed. This is used to select one of the segments as a reference voltage.

The reference voltages are selected so that the removed bits are maintained below the Photon Shot Noise. Accordingly, no degradation in image quality will be seen.

After the segment is selected, the reference voltage of that segment is reused as a reference to resolve the remaining fine bits of the signal Vin 201. The fine 8-bit conversion is done using binary weighted capacitors 230, each capacitor in the group being double the size of the previous capacitor. The signal is compared with the reference using these capacitors, and a successive approximation register 235 is used to output the binary signal. In operation, for example, the difference between the input signal 201 and the selected reference signal 202 is connected to one side of the system comparator 240. The other side of the system comparator receives the reset level 245 from the system. The result is either high or low depending on the relationship between the input signal and the reset level. The series of high and low values is encoded by the successive approximation register to create the digital output 250.

Figure 3A:
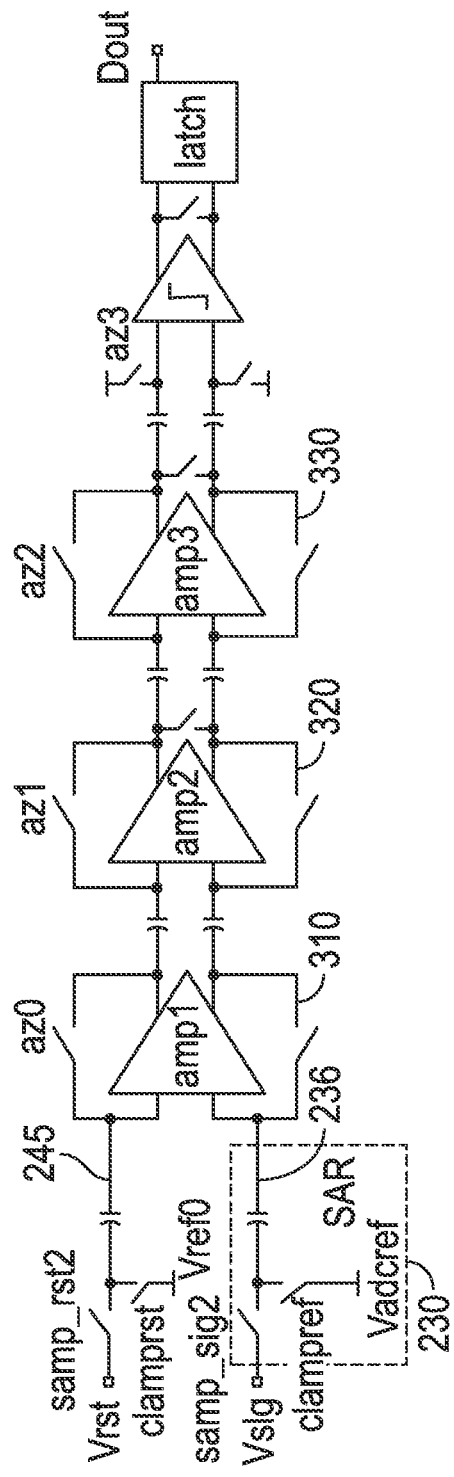
FIGS. 3A and 3B shows circuit and timing circuits for the amplifier and comparator used according to an embodiment.
Figure 3B:
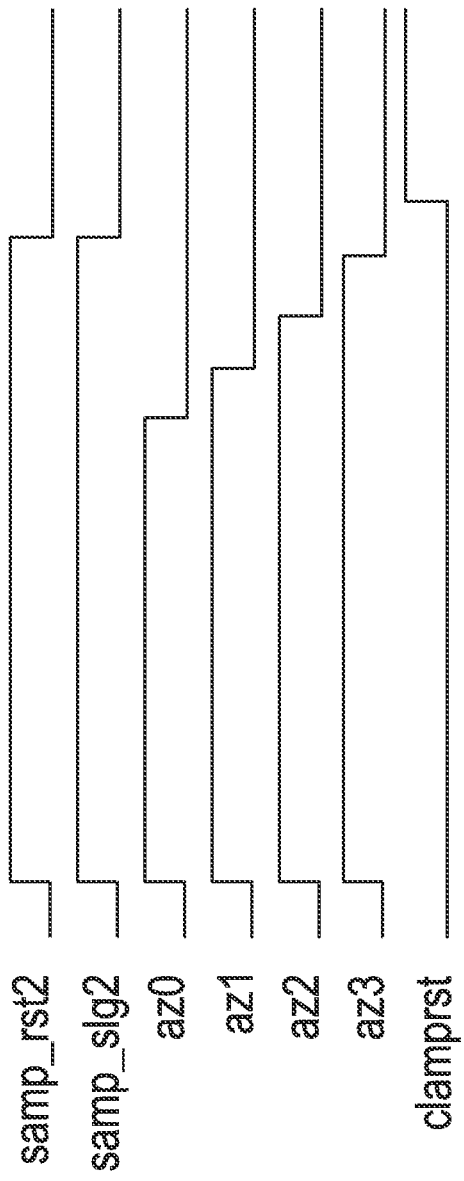

The comparator 240 may be a multistage comparator as shown in FIG. 3A. The block diagram of FIG. 3A shows one side of the comparator receiving the reset level 245 and the other side of the comparator receiving the output value 236 from the capacitor stage 230 of the successive approximation register. In operation, the Multi-stage comparator is designed to provide the highest gain to resolve the highest ENOB using three selectively clamped stages 310, 320, 330. The three stages 310,320,330 are clamped during the sampling of the input signal to autozero and cancel out the preamp's offset. In FIG. 3B, when az0,az1,az2,az3 are on, 310,320,330 are clamped. As those switches turn off, each preamp's offset are stored in the capacitors between the stages. However, for lower ENOB ranges, the gain of the comparator can be relaxed. Therefore the preamps 310, 320 can be selectively powered down based on the 3 bit ENOB selection. For example, for the lowest range of ENOB selections, both the preamps 310 and 320 can be powered down. For the midrange of ENOB selections, just the preamp 310 is powered down. For the highest range of ENOB all of the preamps are operational. Power reduction on average can be achieved.

FIG. 3B illustrates the switching operations of the different switches.

This architecture addresses the first challenge of the DAC area by reducing the number of capacitors required to achieve high bit resolution. The fine 8 bits set the number of total unit capacitors needed, which in this case are only 256. The second challenge, of capacitor ratio matching, is alleviated by the two-step approach of the A/D conversion. In our case, the matching requirement of the capacitors is 8 bits, which can be easily achieved using good layout practices. To address the third challenge of scalability, the reference voltages are routed periodically to external decoupling caps in a block design approach.

Figure 4:
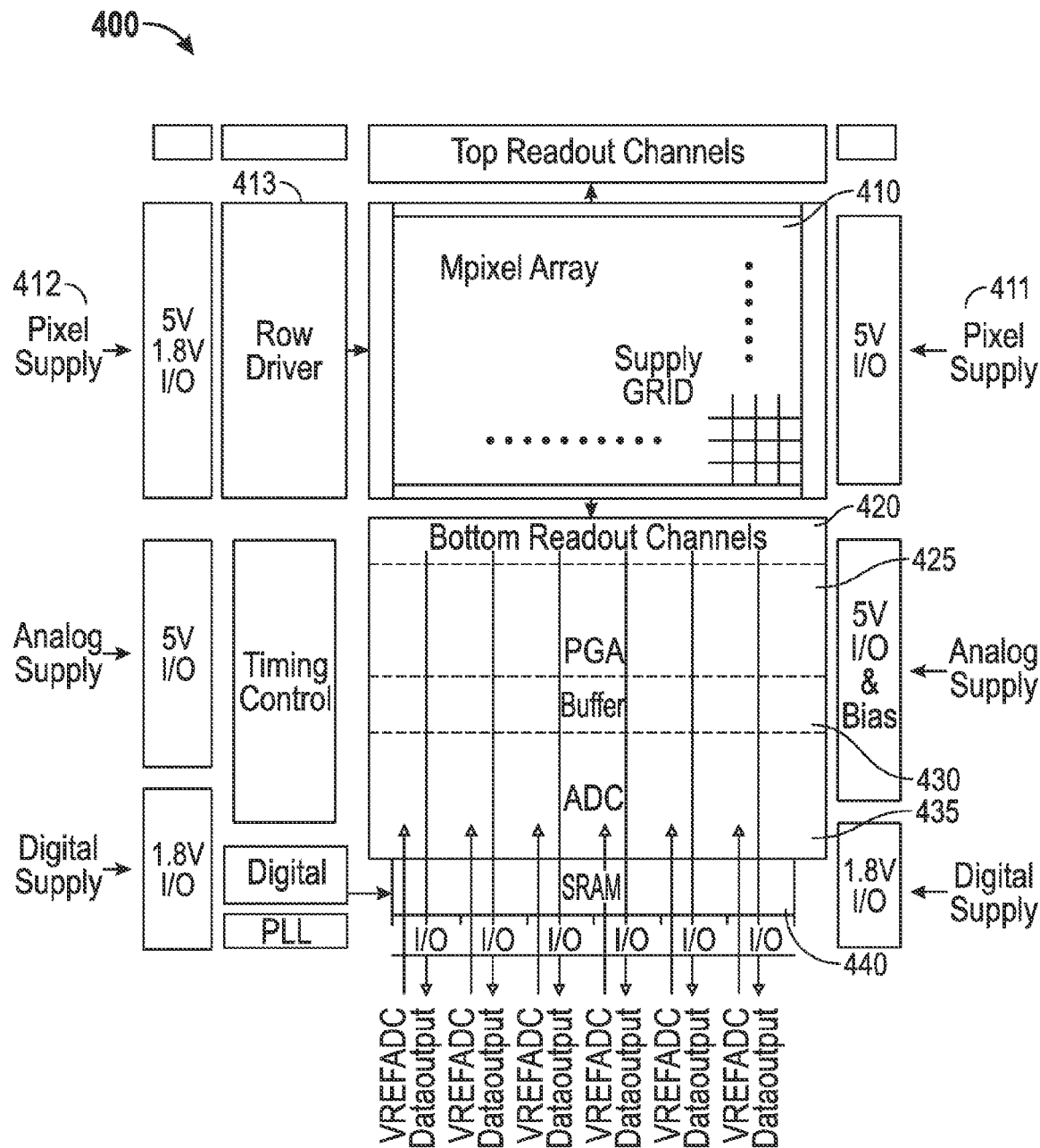
FIG. 4 shows a circuit layout.

FIG. 4 shows a block diagram of the architecture. In FIG. 4, the chip 400 includes a pixel array 410 which receives power at multiple sides for 11 412 of the pixel array. A row driver 413 provides the different rows. The bottom readout channels shown at 420 include associated circuitry including a programmable gate array 425 for switching, a buffer 430, and the ADC 435 as described herein. The data may also be stored in SRAM 440 prior to being output. With this routing, the settling of the ADC reference voltages no longer depends on the total column size.

The above has described use of this system with a successive approximation type device. However, it should also be understood that the system can be used with other kinds of A/D converters. For example, this system could be used in the Sigma Delta A/D converter, by outputting fewer bits from the A/D converters.

Also, in this embodiment, the compression has been described as being carried out by outputting fewer bits. However, according to another embodiment, the compression is carried out using a lossy compression system that more actively selects the number of bits to be output.

Although only a few embodiments have been disclosed in detail above, other embodiments are possible and the inventors intend these to be encompassed within this specification. The specification describes specific examples to accomplish a more general goal that may be accomplished in another way. This disclosure is intended to be exemplary, and the claims are intended to cover any modification or alternative which might be predictable to a person having ordinary skill in the art. For example, other kinds of A/D converters can be used in the system.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments.

The various illustrative logical blocks, modules, and circuits described in connection with the embodiments disclosed herein, may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. The processor can be part of a computer system that also has a user interface port that communicates with a user interface, and which receives commands entered by a user, has at least one memory (e.g., hard drive or other comparable storage, and random access memory) that stores electronic information including a program that operates under control of the processor and with communication via the user interface port, and a video output that produces its output via any kind of video output format, e.g., VGA, DVI, HDMI, displayport, or any other form. This may include laptop or desktop computers, and may also include portable computers, including cell phones, tablets such as the IPAD™, and all other kinds of computers and computing platforms.

A processor may also be implemented as a combination of computing devices, e.g., a combination of a DSP and a microprocessor, a plurality of microprocessors, one or more microprocessors in conjunction with a DSP core, or any other such configuration. These devices may also be used to select values for devices as described herein.

The steps of a method or algorithm described in connection with the embodiments disclosed herein may be embodied directly in hardware, in a software module executed by a processor, using cloud computing, or in combinations. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of tangible storage medium that stores tangible, non transitory computer based instructions. An exemplary storage medium is coupled to the processor such that the processor can read information from, and write information to, the storage medium. In the alternative, the storage medium may be integral to the processor. The processor and the storage medium may reside in reconfigurable logic of any type.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer.

The memory storage can also be rotating magnetic hard disk drives, optical disk drives, or flash memory based storage drives or other such solid state, magnetic, or optical storage devices. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media. The computer readable media can be an article comprising a machine-readable non-transitory tangible medium embodying information indicative of instructions that when performed by one or more machines result in computer implemented operations comprising the actions described throughout this specification.

Operations as described herein can be carried out on or over a website. The website can be operated on a server computer, or operated locally, e.g., by being downloaded to the client computer, or operated via a server farm. The website can be accessed over a mobile phone or a PDA, or on any other client. The website can use HTML code in any form, e.g., MHTML, or XML, and via any form such as cascading style sheets ("CSS") or other.

Also, the inventor(s) intend that only those claims which use the words "means for" are intended to be interpreted under 35 USC 112, sixth paragraph. Moreover, no limitations from the specification are intended to be read into any claims, unless those limitations are expressly included in the claims. The computers described herein may be any kind of computer, either general purpose, or some specific purpose computer such as a workstation. The programs may be written in C, or Java, Brew or any other programming language. The programs may be resident on a storage medium, e.g., magnetic or optical, e.g. the computer hard drive, a removable disk or media such as a memory stick or SD media, or other removable medium. The programs may also be run over a network, for example, with a server or other machine sending signals to the local machine, which allows the local machine to carry out the operations described herein.

Where a specific numerical value is mentioned herein, it should be considered that the value may be increased or decreased by 20%, while still staying within the teachings of the present application, unless some different range is specifically mentioned. Where a specified logical sense is used, the opposite logical sense is also intended to be encompassed.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An A/D converter system, comprising
a first part that sets a coarse range selection based on a level of an input signal, where a higher level input signal has a higher level ranging, and
an A/D converter part which includes a compression system that compresses based on the level of the input signal, where said A/D converter part converts fewer bits for a higher level input signal, making said higher-level input signal more highly compressed, where a bit accuracy of the A/D converter part is adjusted by said first part to lose bits below a level of shot noise.

2. The A/D converter as in claim 1, wherein said A/D converter part has multiple different parts, and is controlled to turn on fewer parts for the higher level signal.

3. The A/D converter as in claim 1, wherein said A/D converter part is a successive approximation A/D converter.

4. The A/D converter as in claim 1, wherein the A/D converter part includes plural different amplifiers connected to operate as a comparator.

5. An A/D converter system, comprising
a first part that sets a coarse range selection based on a level of an input signal, where a higher level input signal has a higher level ranging, and
an A/D converter which includes a compression system that compresses based on the level of the input signal, where a higher level input signal is more highly compressed, wherein the A/D converter includes plural different amplifiers connected to operate as a comparator, wherein said A/D converter system also selects a number of said amplifiers that are active at any one time.

6. The A/D converter as in claim 5, wherein said converter creates a ranging signal, and a highest level ranging signal causes all of said amplifiers to be active, and wherein a lowest level ranging signal causes less than all of said amplifiers to be active.

7. An A/D converter system, comprising:
a ranging detector that receives and characterizes an input signal, and creates a ranging output signal, where said ranging output signal sets a coarse range selection based on a level of the input signal, where said coarse range includes multiple different ranges, and where a higher level input signal has a higher level ranging, and an A/D converter which includes a compression system that compresses based on the ranging output signal by converting different numbers of bits for different level ranging output signal, where a higher level input signal is more higher compressed and produces a digital output indicative of the input signal, which is compressed by different amounts based on the ranging output signal.

8. The A/D converter system as in claim 7, wherein said A/D converter is a successive approximation A/D converter.

9. The A/D converter as in claim 8, wherein the A/D converter includes plural different amplifiers connected to operate as a comparator.

10. The A/D converter as in claim 9, wherein said ranging output also selects a number of said amplifiers that are active at any one time.

11. The A/D converter as in claim 10, wherein a highest level of said ranging output signal causes all of said amplifiers to be active, and wherein a lowest level of said ranging output signal causes less than all of said amplifiers to be active.

12. An A/D converter system, comprising:
a ranging detector that receives and characterizes an input signal, and creates a ranging output signal, where said ranging output signal sets a coarse range selection based on a level of the input signal, where said coarse range includes multiple different ranges, and where a higher level input signal has a higher level ranging, and an successive approximation A/D converter which uses a ladder of different level capacitors, a successive approximation register, and multiple amplifiers configured to carry out a comparator function, wherein said ranging output signal selects a number of said amplifiers that are active at any one time, wherein a highest level of said ranging output signal causes all of said amplifiers to be active, and wherein a lowest level of said ranging output signal causes less than all of said amplifiers to be active.

13. The A/D converter system as in claim 12, wherein said successive approximation A/D converter includes a compression system that compresses based on the ranging output signal by converting different numbers of bits for different level ranging output signal, where a higher level input signal is more higher compressed and produces a digital output indicative of the input signal, which is compressed by different amounts based on the ranging output signal.

* * * * *